(12) United States Patent
Niitsu et al.

(10) Patent No.: US 9,318,820 B2
(45) Date of Patent: Apr. 19, 2016

(54) CONNECTOR FOR MULTI-LAYERED BOARD

(71) Applicant: Molex, LLC, Lisle, IL (US)

(72) Inventors: Toshihiro Niitsu, Machida (JP); Motohisa Haga, Yamato (JP)

(73) Assignee: Molex, LLC, Lisle, IL (US)

(*) Notice: Subject to any disclaimer, the term of this patent is extended or adjusted under 35 U.S.C. 154(b) by 0 days.

(21) Appl. No.: 14/227,574

(22) Filed: Mar. 27, 2014

(65) Prior Publication Data

US 2014/0295697 A1    Oct. 2, 2014

(30) Foreign Application Priority Data

Mar. 27, 2013    (JP) .................. 2013-065641

(51) Int. Cl.

| H01R 13/62 | (2006.01) |
| H01R 12/52 | (2011.01) |
| H01R 12/79 | (2011.01) |
| H05K 1/11 | (2006.01) |
| H05K 3/36 | (2006.01) |
| H05K 3/32 | (2006.01) |
| H05K 3/40 | (2006.01) |

(52) U.S. Cl.
CPC .............. *H01R 12/523* (2013.01); *H01R 12/79* (2013.01); *H05K 1/117* (2013.01); *H05K 3/365* (2013.01); *H05K 3/368* (2013.01); *H05K 3/326* (2013.01); *H05K 3/403* (2013.01); *H05K 2201/0367* (2013.01); *H05K 2201/0919* (2013.01); *H05K 2201/09163* (2013.01); *H05K 2201/09863* (2013.01); *H05K 2201/10303* (2013.01); *H05K 2201/10386* (2013.01)

(58) Field of Classification Search
CPC ...... H01R 12/523; H01R 12/79; H05K 3/365; H05K 1/118

USPC ..................... 439/492, 493, 67, 77
See application file for complete search history.

(56) References Cited

U.S. PATENT DOCUMENTS

| 5,741,148 A * | 4/1998 | Biernath .............. H01R 12/79 439/284 |
| 7,210,942 B2 * | 5/2007 | Uchida ................. H05K 3/363 439/67 |
| 7,238,044 B2 | 7/2007 | Uchida et al. |
| 7,261,569 B2 * | 8/2007 | Uchida ................. H05K 3/365 439/492 |
| 8,215,965 B2 * | 7/2012 | Mizoguchi ............ H05K 3/326 361/760 |
| 8,439,689 B2 * | 5/2013 | Niitsu et al. .................... 439/65 |
| 2013/0052861 A1 * | 2/2013 | Niitsu et al. ................. 439/492 |

FOREIGN PATENT DOCUMENTS

JP         2012099447 A  *  5/2012

* cited by examiner

*Primary Examiner* — Hae Moon Hyeon
(74) *Attorney, Agent, or Firm* — James A. O'Malley

(57) ABSTRACT

A connector for a multilayered board to connect a flat cable to a middle layer of a multilayered board while minimizing the impact due to variations in the dimensional precision and strength of multilayered boards and/or preventing deformation of the multilayered board and improving contact stability. The connector includes a board-side connecting portion and a cable-side connecting portion. The board-side connecting portion includes a column-shaped terminal, and the cable-side connecting portion includes flat terminals. The column-shaped terminal protrudes from the middle layer of the multilayered board in the thickness direction. The flat terminals include resilient contact portions, contacting a side surface portion of the column-shaped terminal from the width direction of the insertion slot in response to insertion of the cable-side connecting portion into the insertion slot.

16 Claims, 13 Drawing Sheets

CONNECTOR FOR MULTI-LAYERED BOARD

CROSS REFERENCE TO RELATED APPLICATIONS

The Present Disclosure claims priority to prior-filed Japanese Patent Application No. 2013-065641, entitled "Connector For Multi-Layered Board," filed on 27 Mar. 2013 with the Japanese Patent Office. The content of the aforementioned Patent Application is fully incorporated in its entirety herein.

BACKGROUND OF THE PRESENT DISCLOSURE

The Present Disclosure relates, generally, to a connector for a multilayered board used to connect a flat cable, such as a flexible printed cable, to a middle layer of a multilayered board.

Multilayered boards, which are printed circuit boards formed in layers, are commonly used in electronic devices, such as mobile phones and smartphones, in response to the increasing density of wiring patterns. A flat cable, such as a flexible printed cable, is used to connect a multilayered board to an electronic component module and to connect multilayered boards to each other.

When a flat cable is connected to a multilayered board, a connector is installed in the surface layer of the multilayered board, and the flat cable is connected to the connector. When a connector is installed in the surface layer of a multilayered board, the connector increases the thickness dimension of the multilayered board, and the connector occupies a large amount of area on the multilayered board. These connectors may impede further miniaturization of multilayered boards and electronic devices.

Connecting a flat cable to a middle layer of a multilayered board has recently been proposed. For example, a multilayered board connecting mechanism has been proposed in U.S. Pat. No. 7,238,044, in which a flat cable is connected electrically to a multilayered board by inserting the flat cable into an insertion slot formed on the board-thickness surface of the multilayered board. The content of the aforementioned Patent is hereby incorporated herein in its entirety.

FIG. 15 is a simplified cross-sectional view showing a conventional connector for a multilayered board. As shown, the connector used to connect the flat cable 3 to a middle layer of the multilayered board 2 has a board-side connecting portion 801 arranged inside an insertion slot 2a formed on a board-thickness surface of the multilayered board 2, and a cable-side connecting portion 901 provided on the tip of the flat cable 3. A plate-spring terminal 851 provided on the board-side connecting portion 801 makes resilient contact with the terminal portion of the cable-side connecting portion 901 in response to the insertion of the cable-side connecting portion 901 into the insertion slot 2a. Alternatively, as disclosed in the '044 Patent, the flat cable 3 is connected electrically to a middle layer of the multilayered board 2 by a plate-spring terminal provided on the cable-side connecting portion making resilient contact with a terminal of the board-side connecting portion.

However, a connector for a multilayered board of the prior art, as shown in FIG. 15 and described in the '044 Patent, sustains the reaction force of the plate-sprint terminal 851 in the top laminated substrate (first laminated substrate 2b) or the bottom laminated substrate (third laminated substrate 2d) of the insertion slot 2a. As a result, the contact space of the plate-sprint terminal 851 (the amount of displacement by the spring) is affected by variations in the dimensional precision and strength of multilayered boards 2, and/or resistance to the resilient force of the plate-spring terminal 851 deforms the multilayered board 2. Therefore, contact stability may not be achieved.

SUMMARY OF THE PRESENT DISCLOSURE

In light of this problem, it is an object of the Present Disclosure to connect a flat cable to a middle layer of a multilayered board while minimizing the impact due to variations in the dimensional precision and strength of multilayered boards and/or preventing deformation of the multilayered board 2 and improving contact stability.

The Present Disclosure achieves this object by providing a connector for a multilayered board comprising a board-side connecting portion arranged inside an insertion slot formed on a board-thickness surface of a multilayered board, and a cable-side connecting portion provided on the tip of a flat cable and inserted into the insertion slot to be connected electrically to the board-side connecting portion in a middle layer of the multilayered board. Either the board-side connecting portion or the cable-side connecting portion being provided with a column-shaped terminal and the other with a late-shaped terminal. The column-shaped terminal formed so as to protrude from the middle layer of the multilayered board or from the tip of the flat cable in the thickness direction of the multilayered board or the flat cable. The flat terminal being provided with a resilient contact portion making resilient contact with a side surface portion of the column-shaped terminal from the width direction of the insertion slot in response to insertion of the cable-side connecting portion into the insertion slot.

The flat terminal and the column-shaped terminal may have a plurality of contact spots, and the reaction forces of the flat terminal generated at the plurality of contact spots may cancel each other out. The reaction force of the flat terminal making contact with the column-shaped terminal from one side may cancel out the reaction force of the flat terminal making contact with the column-shaped terminal from the other side. The reaction force of the flat terminal making contact with the column-shaped terminal from one side may cancel out the reaction force of the flat terminal making contact with another column-shaped terminal from the other side. The column-shaped terminal may also be provided with a small-diameter portion defining the contact position of the flat terminal. The column-shaped terminal may be a protrusion formed using an etching method. The board-side connecting portion may also be provided with a column-shaped terminal and an insertion guide formed using an etching method, and insertion of the cable-side connecting portion into the insertion slot may be guided by the insertion guide.

The Present Disclosure is able to connect a flat cable to a middle layer of a multilayered board while minimizing the impact due to variations in the dimensional precision and strength of multilayered boards and/or preventing deformation of the multilayered board and improving contact stability.

BRIEF DESCRIPTION OF THE FIGURES

The organization and manner of the structure and operation of the Present Disclosure, together with further objects and advantages thereof, may best be understood by reference to the following Detailed Description, taken in connection with the accompanying Figures, wherein like reference numerals identify like elements, and in which.

DESCRIPTION OF THE PREFERRED EMBODIMENTS

While the Present Disclosure may be susceptible to embodiment in different forms, there is shown in the Figures, and will be described herein in detail, specific embodiments, with the understanding that the Present Disclosure is to be considered an exemplification of the principles of the Present Disclosure, and is not intended to limit the Present Disclosure to that as illustrated.

As such, references to a feature or aspect are intended to describe a feature or aspect of an example of the Present Disclosure, not to imply that every embodiment thereof must have the described feature or aspect. Furthermore, it should be noted that the description illustrates a number of features. While certain features have been combined together to illustrate potential system designs, those features may also be used in other combinations not expressly disclosed. Thus, the depicted combinations are not intended to be limiting, unless otherwise noted.

In the embodiments illustrated in the Figures, representations of directions such as up, down, left, right, front and rear, used for explaining the structure and movement of the various elements of the Present Disclosure, are not absolute, but relative. These representations are appropriate when the elements are in the position shown in the Figures. If the description of the position of the elements changes, however, these representations are to be changed accordingly.

In the explanation of the embodiments herein, elements that are identical in all embodiments are denoted by the same reference numbers. Further, in the explanation of the multilayered boards (board-side connecting portions), the board-thickness surface on which the insertion slot has been formed for the flat cable (cable-side connecting portion) is the front surface, the direction in which the flat cable is inserted into the insertion slot is the longitudinal direction, the thickness direction of the multilayered board is the vertical direction, and the width direction of the insertion slot is the lateral direction. Further, in the explanation of the flat cables (cable-side connecting portions), the direction in which the flat cable is inserted into the insertion slot is the longitudinal direction, the thickness direction of the flat cable is the vertical direction, and the width direction of the flat cable is the lateral direction.

Figure 1:
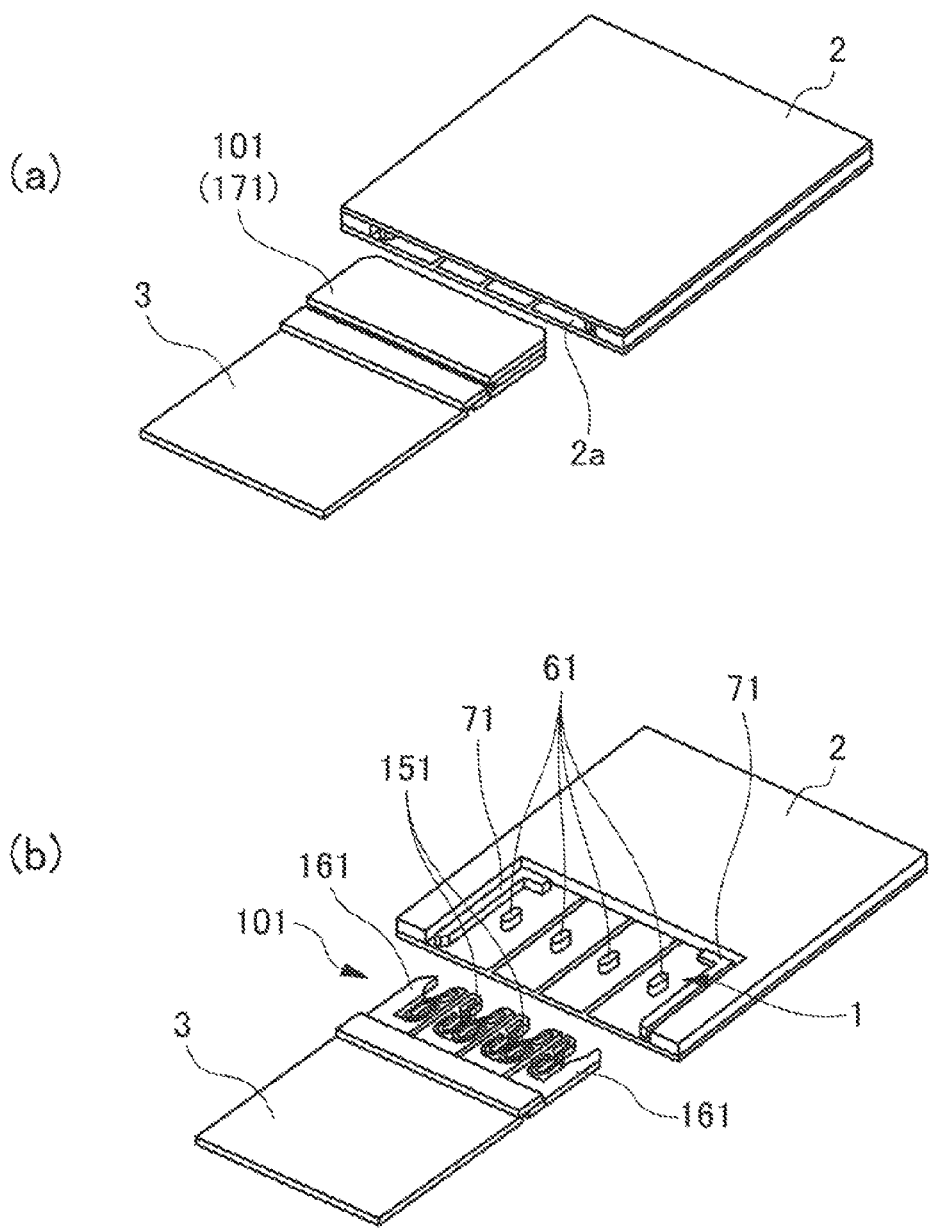
FIG. 1 shows the multilayered board and the flat cable in the connector for a multilayered board according to an embodiment of the Present Disclosure, in which (a) is a perspective view showing the disconnected state, and (b) is a perspective view in which a portion has been removed to expose the board-side connecting portion and the cable-side connecting portion.

FIG. 1 shows the multilayered board and the flat cable in the connector for a multilayered board according to a first embodiment of the Present Disclosure, in which (a) is a perspective view showing the disconnected state, and (b) is a perspective view in which a portion has been removed to expose the board-side connecting portion and the cable-side connecting portion. As shown, the connector for a multilayered board according to the first embodiment includes a board-side connecting portion 1 arranged inside the insertion slot 2a formed in the board-thickness surface of the multilayered board 2, and a cable-side connecting portion 101 provided on the tip of the flat cable 3 and inserted into the insertion slot 2a to be connected electrically to the board-side connecting portion 1 in a middle layer of the multilayered board 2.

The multilayered board 2 and the flat cable 3 are not shown in the drawing in their entirety. The portion in which the board-side connector is provided has been trimmed. For example, the flat cable 3 is usually a long band-shaped member. However, in the drawing, the rear portion (at the lower left in FIG. 1) has been omitted for the sake of convenience.

Figure 2:
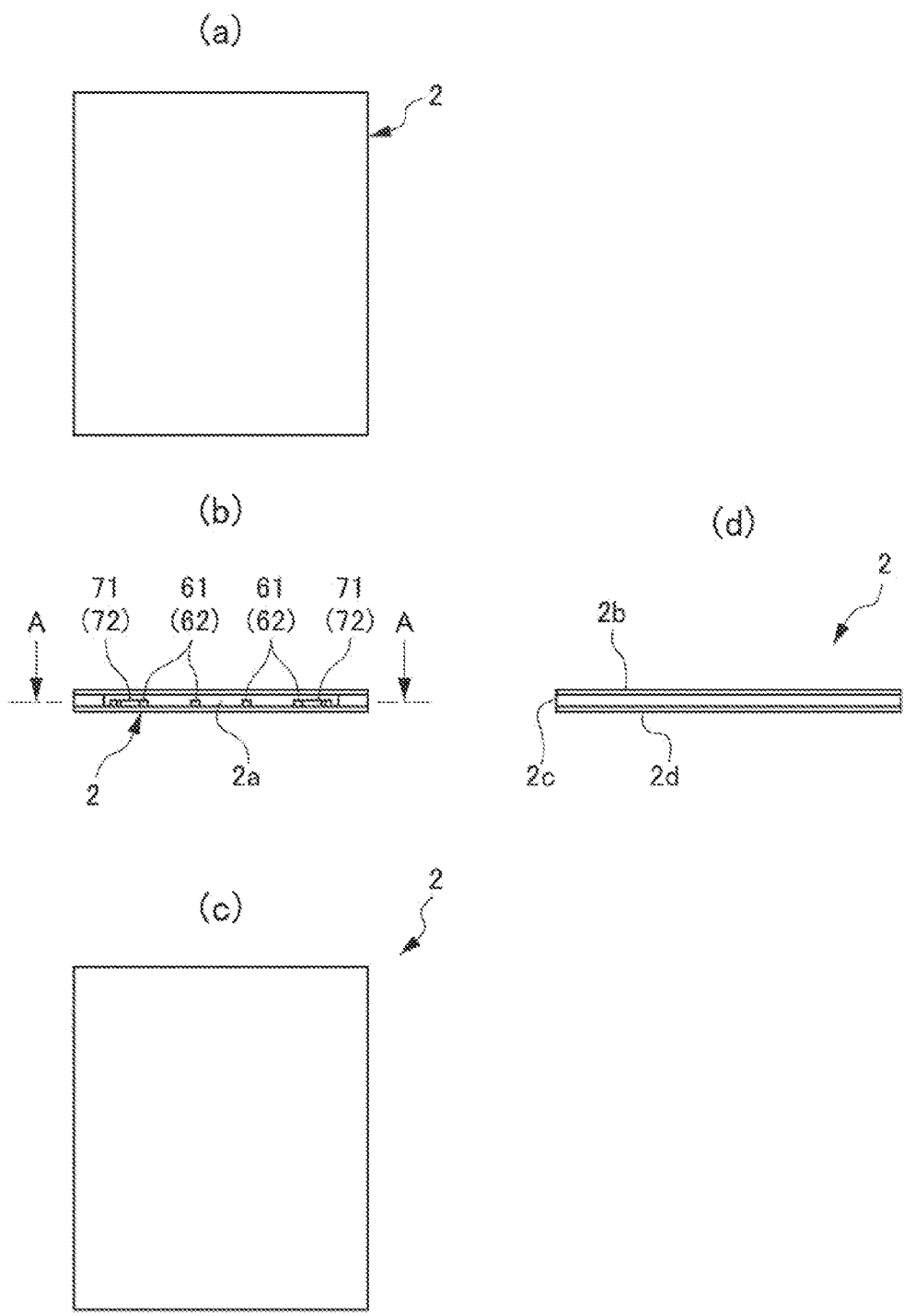
FIG. 2 shows the multilayered board in the connector for the multilayered board of FIG. 1, in which (a) is a top view of the multilayered board, (b) is a front view of the multilayered board, (c) is a bottom view of the multilayered board, and (d) is a side view of the multilayered board.

FIG. 2 shows the multilayered board in the connector for a multilayered board according to the first embodiment of the Present Disclosure, in which (a) is a top view of the multilayered board, (b) is a front view of the multilayered board, (c) is a bottom view of the multilayered board, and (d) is a side view of the multilayered board. As shown, the multilayered board 2 is a printed circuit board with multiple layers. For example, the multilayered board 2 in the present embodiment is a three-layered printed circuit board. The substrate on the top is the first laminated substrate 2b, the substrate in the middle is the second laminated substrate 2c, and the substrate on the bottom is the third laminated substrate 2d.

Figure 3:
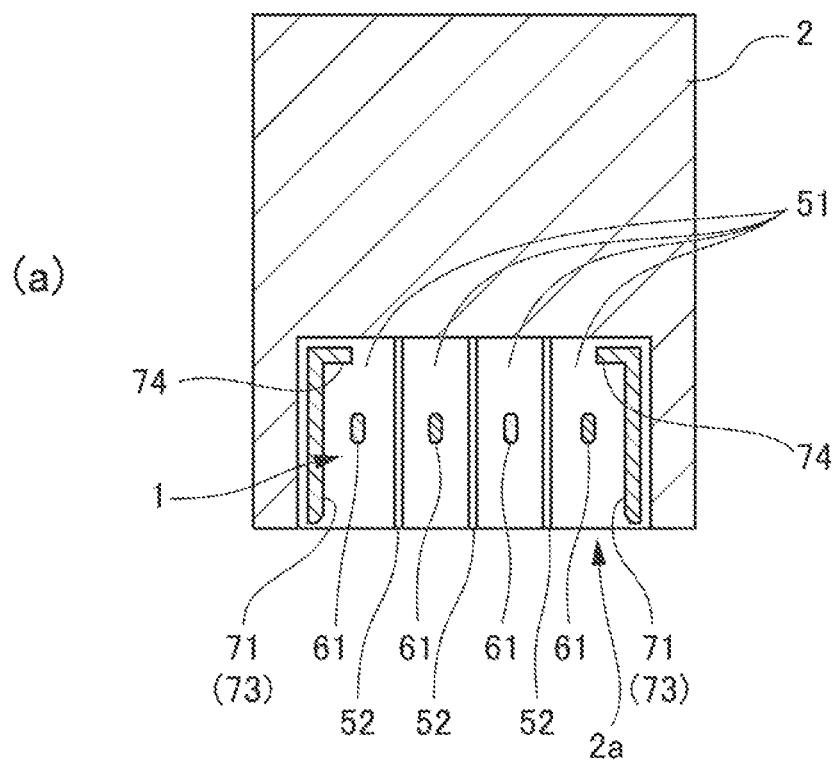
FIG. 3 shows the multilayered board in the connector for the multilayered board of FIG. 1, in which (a) is an A-A cross-sectional view of the multilayered board, and (b) is an enlarged front view of a column-shaped terminal.
Figure 3:
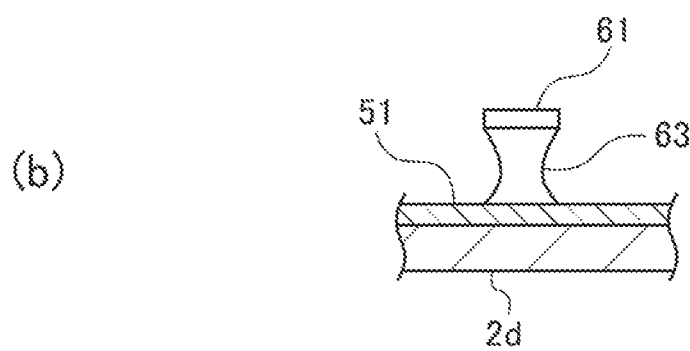

FIG. 3 shows the multilayered board in the connector for a multilayered board according to the first embodiment of the Present Disclosure, in which (a) is an A-A cross-sectional view of the multilayered board, and (b) is an enlarged front view of a column-shaped terminal. As shown, a rectangular portion of the second laminated substrate 2c in the multilayered board of the present embodiment is removed to form an insertion slot 2a. A board-side connecting portion 1 is provided inside the insertion slot 2a which includes a conductive pattern 51, a column-shaped terminal 61, and an insertion guide 71. The vertical dimensions of the multilayered board 2 and the insertion slot 2a in the present embodiment are 0.7 mm and 0.4 mm, but the Present Disclosure is not limited to this embodiment. Other dimensions may also be used.

The conductive pattern 51 is provided on the bottom surface or the tip surface inside the insertion slot 2a. For example, in the present embodiment, four conductive patterns 51 are provided on the top surface of the third laminated substrate 2d which forms the bottom surface inside the insertion slot 2a. Each conductive pattern 51 extends longitudinally and in parallel from left to right. These are connected to other conductive patterns not shown in the multilayered board 2. Adjacent conductive patterns 51 are separated by an insulating space 52.

A column-shaped terminal 61 protrudes upward from the surface of each conductive pattern 51. These can be formed integrally with the conductive patterns 51 by etching copper foil with spring action and a thickness ranging from several to several dozen micrometers using a photolithographic technique. In the present embodiment, the height of a column-shaped terminal 61 is somewhat lower than the height of the insertion slot 2a. A predetermined space 62 is maintained between the top surface of the column-shaped terminals 61 and the top surface of the insertion slot 2a (or the bottom surface of the first laminated substrate 2b). The top surface of the column-shaped terminals 61 may come into contact with the top surface of the insertion slot 2a, but in this case the substrates defining the top surface and the bottom surface of the insertion slot 2a (the bottom surface of the first laminated substrate 2b and the top surface of the third laminated substrate 2d in the present embodiment) can be deformed to keep the vertical dimensions of the insertion slot 2a from becoming too narrow.

The shape of the top surface and cross-section of the column-shaped terminal 61 is preferably oblong with the dimension in the longitudinal direction being larger than the dimension in the lateral direction. The front end (on the opening side of the insertion slot 2a) is also preferably pointed. This shape allows for the relatively smooth insertion of the cable-side connecting portion 101 (the column-shaped terminal insertion portions 154, 164) with respect to the column-shaped terminals 61. In the present embodiment, the shape of the top surface and cross-section of the column-shaped terminal 61 is oblong, but it may also have another shape, including a pentagonal shape, such as the shape of home plate on a baseball diamond, a hexagonal shape or a round shape.

A recessed surface is preferably formed in the side surface of the column-shaped terminal 61 as shown in FIG. 3(b). This recessed surface can define the contact positions of the cable-side connecting portion 101 (resilient contact portions 155, 165) with the side surface portion of the column-shaped terminal 61, and can stabilize the contact. For example, in the present embodiment, the central portion of the column-shaped terminal 61 in the height direction forms a small-diameter portion 63, and the diameter gradually increases from the small-diameter portion 63 towards the base and the tip of the terminal to form a recessed portion with an indented shape.

An insertion guide 71 is provided on both the left and right ends of the insertion slot 2a to guide the insertion of the cable-side connecting portion 101 into the insertion slot 2a. In the present embodiment, the insertion guides 71 are protrusions which protrude upward from the surface of the conductive patterns 51 at the left and right ends of the insertion slot 2a. These can be formed along with the conductive patterns 51 and the column-shaped terminals 61 using an etching method employing a photolithographic technique. The height of the insertion guides 71 is somewhat lower than the height of the insertion slot 2a. The guides do not have to make contact with each other but maintain a predetermined space 72 between the top surface of the insertion guides 71 and the top surface of the insertion slot 2a (the bottom surface of the first laminated substrate 2b).

The top surface and cross-section of the insertion guides 71 can have any shape as long as they guide the insertion of the cable-side connecting portion 101. Preferably, the insertion guide portions 73 not only extend longitudinally along both the left and right sides of the insertion slot 2a to guide the insertion of the cable-side connecting portion 101, but a stopper portion 74 extends in the lateral direction to define the limit of insertion for the cable-side connecting unit 101. In the present embodiment, the insertion guide portions 73 and stopper portion 74 are formed integrally, but they may also be formed separately.

Figure 4:
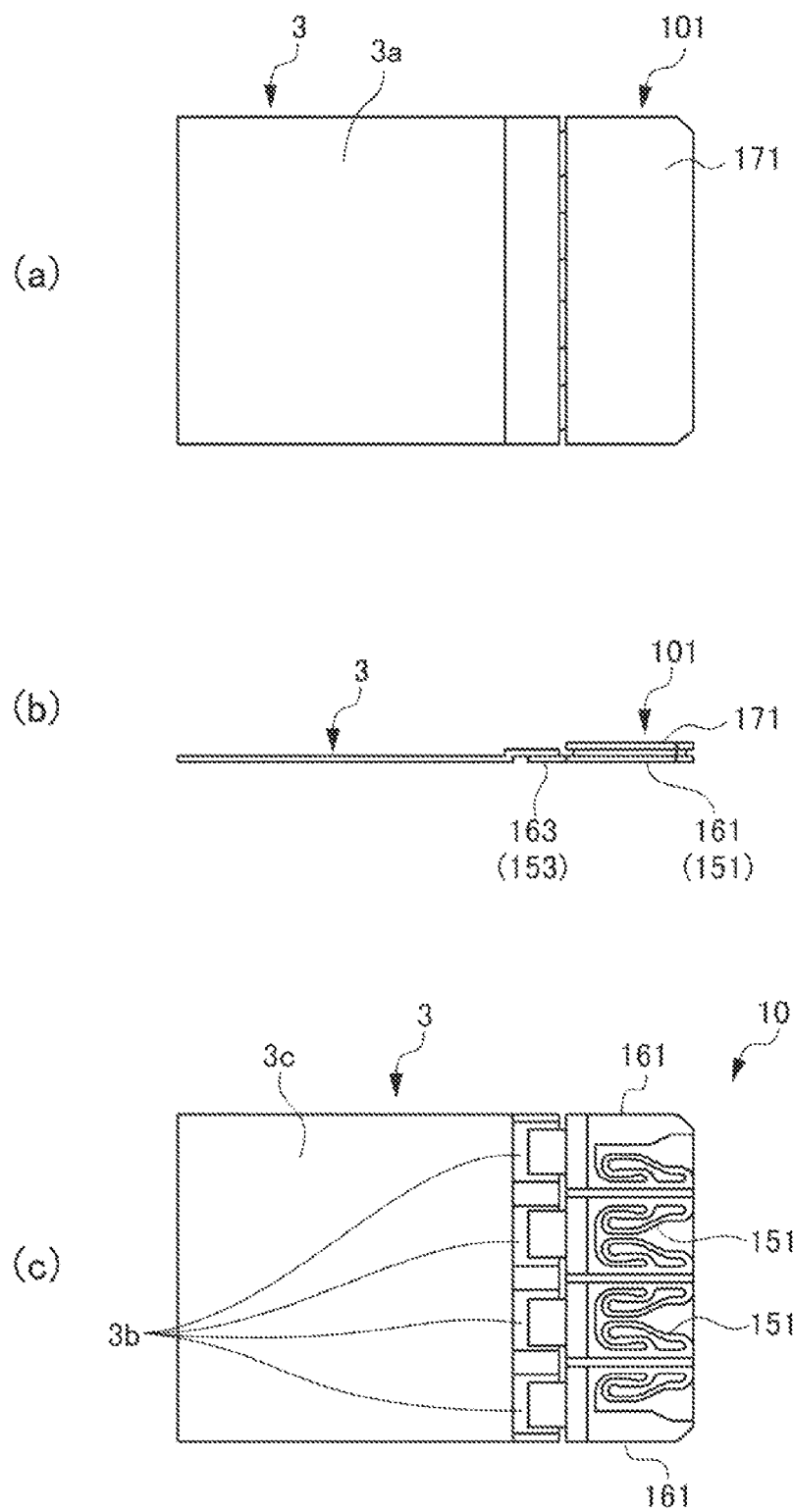
FIG. 4 shows the flat cable in the connector for the multilayered board of FIG. 1, in which (a) is a top view of the flat cable, (b) is a side view of the flat cable, and (c) is a bottom view of the flat cable.

FIG. 4 shows the flat cable in the connector for a multilayered board according to the first embodiment of the Present Disclosure, in which (a) is a top view of the flat cable, (b) is a side view of the flat cable, and (c) is a bottom view of the flat cable. The flat cable 3 is a flexible flat cable such as a flexible printed circuit (FPC) board or a flexible flat cable (FFC). It can be any type of board or cable as long as it is flat.

In the present embodiment, the flat cable 3 is an FPC board which includes a long, band-shaped insulated base film 3a, a number of conductive patterns 3b arranged in parallel on one surface of the base film 3a (four in the present embodiment, and covering film 3c to cover the conductive patterns 3b. The covering film 3c is removed at one end of the flat cable 3 to expose the conductive patterns 3b.

Figure 5:
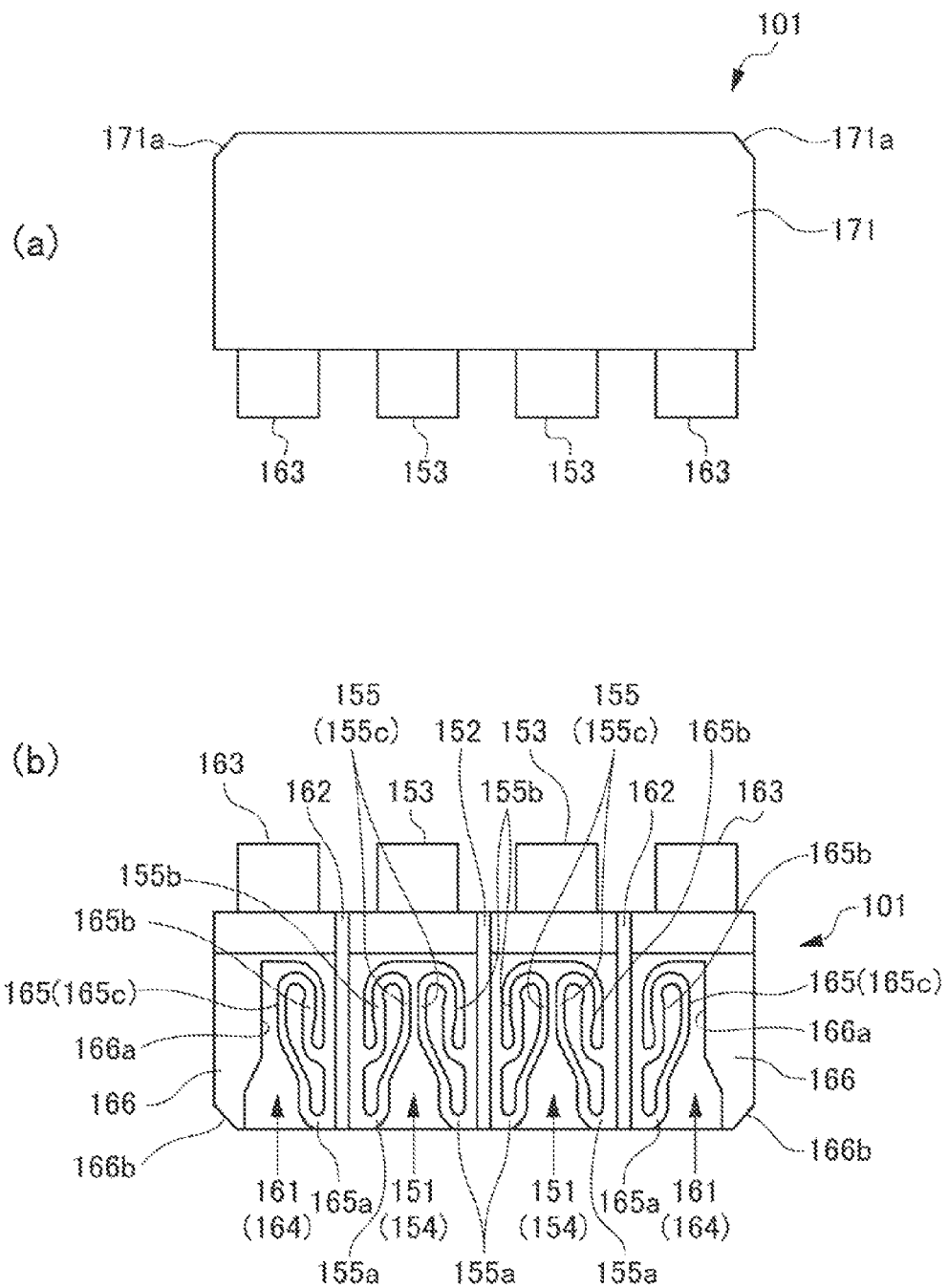
FIG. 5 shows the cable-side connecting portion of the connector for the multilayered board of FIG. 1, in which (a) is an enlarged top view of the cable-side connecting portion, and (b) is an enlarged bottom view of the cable-side connecting portion.

FIG. 5 shows the cable-side connecting portion of the connector for a multilayered board according to the first embodiment of the Present Disclosure, in which (a) is an enlarged top view of the cable-side connecting portion, and (b) is an enlarged bottom view of the cable-side connecting portion. As shown in the drawing, the cable-side connecting portion 101 is an insulating support panel 171 integrally supporting a plurality of flat terminals 151, 161 at a predetermined interval, and has a rectangular planar shape to facilitate insertion into the insertion slot 2a. The cable-side connecting portion 101 is installed on one end of the flat cable 3 so that each flat terminal 151, 161 establishes an electrical connection with its conductive pattern 3b.

The flat terminals 151, 161 can be formed, for example, by etching and patterning copper foil with spring action and a thickness ranging from several to several dozen micrometers. In the example shown in the drawing, a pair of first flat terminals 151 arranged in parallel, and a pair of second flat terminals 161 running parallel to the outside are provided, and the adjacent flat terminals 151, 161 are separated via insulating spaces 152, 162.

In each of the flat terminals 151, 161, a tail portion 153, 163 is integrally formed which protrudes to the rear. Each of the tail portions 153, 163 of the flat terminals 151, 161 is connected electrically to a conductive pattern 3b on the flat cable 3 using solder, an anisotropically conductive sheet, or an adhesive.

Each of the flat terminals 151, 161 includes a column-shaped terminal insertion portion 154, 164 open to the front, and resilient contact portions 155, 165 are formed inside the column-shaped terminal insertion portion 154, 164 to make resilient contact with a column-shaped terminal 61 when connected to the board-side connecting portion 1. In other words, the arrangement of the resilient contact portions 155, 165 is determined by the arrangement of the column-shaped terminals 61. When the arrangement of the column-shaped terminals 61 is changed, the arrangement of the resilient contact portions 155, 165 is changed accordingly.

The resilient contact portions 155, 165 are formed using an etching method employing a photolithographic technique. Typically, the flat terminals 151, 161 are etched and patterned using an etching method to leave the resilient contact portions 155, 165, and the column-shaped terminal insertion portions 154, 164 are formed by removing some of the surrounding material.

The first flat terminals 151 have a symmetrical shape, and a pair of resilient contact portions 155 is provided on the left and right ends of the column-shaped terminal insertion portion 154. Each resilient contact portion 155 includes a base portion 155a connected to the peripheral edge of the column-shaped terminal insertion portion 154, an arm portion 155b extending from the base portion 155a into the column-shaped terminal insertion portion 154, and a contact portion 155c connected to the tip of the arm portion 155b. The arm portion 155b functions as a spring, and allows the contact portion 155c to be resiliently displaced to the left and right.

The space between left and right resilient contact portions 155 in the first flat terminals 151 is wider towards the opening of the column-shaped terminal insertion portion 154 and narrower towards the inside. This allows for smooth guidance of the column-shaped terminals 61 between left and right contact portions 155c. The space between left and right resilient contact portions 155c is narrower than the small-diameter portion 63 of the column-shaped terminals 61. When column-shaped terminals 61 move relative to the contact portions 155c, the left and right contact portions 155c make contact with the side surface portions of the column-shaped terminals 61 and push apart. The spring action of the arm portions 155b establishes resilient contact between the left and right contact portions 155c and the side surface portion of the column-shaped terminal 61 from both the left and the right.

The second flat terminals 161 have a symmetrical plan shape, and include a resilient contact portion 165 and a non-resilient contact portion 166 on both the left and right sides inside the column-shaped terminal insertion portion 164. The resilient contact portion 165 includes a base portion 165a connected to the peripheral edge of the column-shaped terminal insertion portion 164, an arm portion 165b extending from the base portion 165a into the column-shaped terminal insertion portion 164, and a contact portion 165c connected to the tip of the arm portion 165b. The arm portion 165b functions as a spring, and allows the contact portion 165c to be resiliently displaced to the left and right.

The space between resilient contact portion 165 and non-resilient contact portion 166 in the second flat terminals 161 is wider towards the opening of the column-shaped terminal insertion portion 164 and narrower towards the inside. This allows for smooth guidance of the column-shaped terminals 61 between left contact portion 165c of the resilient contact portion 165 and the contact portion 166a of the non-resilient contact portion 166. The space between left and right contact portions 165c, 166a is narrower than the small-diameter portion 63 of the column-shaped terminals 61. When column-shaped terminals 61 move relative to the contact portions 165c, 166a, contact portions 165c, 166a make contact with the side surface portions of the column-shaped terminals 61 and one of the contact portions 165c is pushed away. The spring action of the arm portions 165b establishes resilient contact between the contact portion 165c and the side surface portion of the column-shaped terminal 61 from one side.

The non-resilient contact portion 166 of the second flat terminal 161 is stronger than the resilient contact portion 165, and functions as the guided portion guided by the insertion guide 71 when inserted into the insertion slot 2a. The front end angled portion 166b of the non-elastic contact portion 166 and the front end angled portion 171a of the support panel 171 are beveled at an angle that facilitates easy insertion into the insertion slot 2a.

Figure 6:
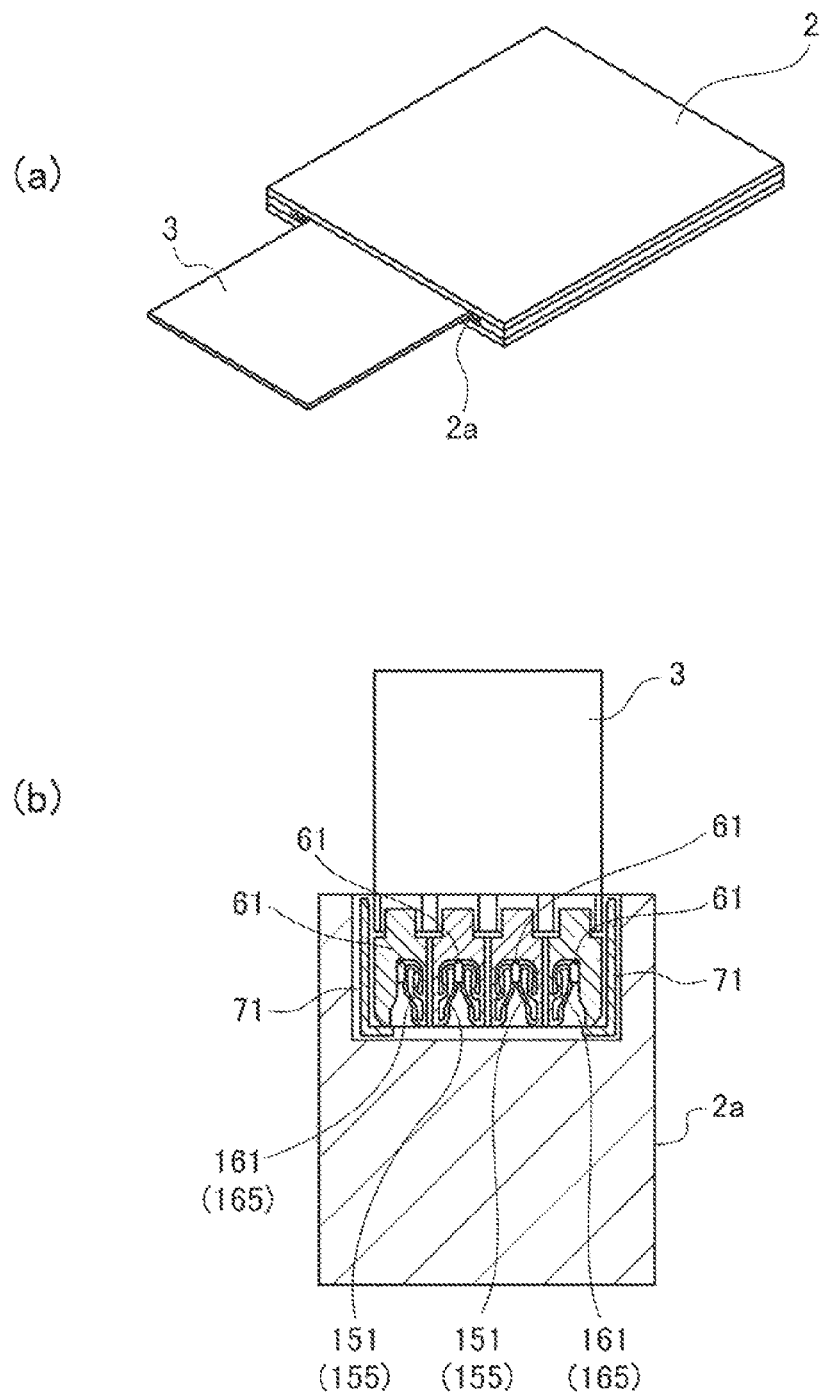
FIG. 6 shows the multilayered board and flat cable in the connector for the multilayered board of FIG. 1, in which (a) is a perspective view showing the connected state, and (b) is a cross-sectional view showing the connected state.

FIG. 6 shows the multilayered board and flat cable in the connector for a multilayered board according to the first embodiment of the Present Disclosure, in which (a) is a perspective view showing the connected state, and (b) is a cross-sectional view showing the connected state. As shown, when the flat cable 3 is connected to the middle layer of the multilayered board 2, the cable-side connecting portion 101 provided on the tip of the flat cable 3 is inserted into the insertion slot 2a formed in the board-thickness surface of the multilayered board 2. The cable-side connecting portion 101 has a front and back. When inserted into the insertion slot 2a with the support panel 171 facing upwards, the support panel 171 passes through the spaces 62, 72 in the insertion slot 2a. This allows the cable-side connecting portion 101 to be inserted. When inserted into the insertion slot 2a with the support panel 171 facing downwards, the support panel 171 comes into contact with the column-shaped terminals 61 and insertion guides 71, and this prevents insertion of the cable-side connecting portion 101. When a cable-side connecting portion 101 is used with the support panel 171 removed from the cable-side connecting portion 101, the top surface of the column-shaped terminals 61 and the insertion guides 71 comes into contact with the bottom surface of the insertion slot 2a, and may be connected to a board-side connecting portion 1 not provided with spaces 62, 72. This configuration can be selected depending on the intended use.

The insertion of the cable-side connecting portion 101 into the insertion slot 2a is guided by the insertion guides 71 provided on the left and right sides of the insertion slot 2a. The non-resilient contact portions 166, which are stronger than the resilient 155, 165 make contact with the insertion guide 71. This prevents damage due to contact with the insertion guides 71.

Because the insertion guides 71 are formed along with the column-shaped terminals 61 during the etching process, their positional relationship to the column-shaped terminals 61 is very good. The guidance provided by the insertion guides 71 can position the flat terminals 151, 161 (resilient contact portions 155, 165) relative to the column-shaped terminals 61 of the board-side connecting portion 1 with a high degree of precision.

When the cable-side connecting portion 101 is inserted into the insertion slot 2a, the flat terminals 151, 161 of the cable-side connecting portion 101 make contact with the column-shaped terminal 61 of the board-side connecting portion 1, and the flat cable 3 is connected electrically to the middle layer of the multilayered board 2. At this time, the resilient contact portions 155, 165 of the flat terminals 151, 161 make resilient contact with the side surface portion of the column-shaped terminal 61 from the lateral direction, and the reaction force of the flat terminals 151, 161 does not have to be sustained by the upper and lower laminated substrates 2b, 2d in the insertion slot 2a. Thus, the contact spaces of the flat terminals 151, 161 avoid being affected by variations in the dimensional precision and strength of multilayered boards 2 or deformation of the multilayered board 2 is prevented. The result is improved contact stability.

More specifically, when the cable-side connecting portion 101 is inserted into the insertion slot 2a, the left and right resilient contact portions 155 in the first flat terminal 151 of the cable-side connecting portion 101 make contact with the side surface portions of the column-shaped terminal 61 and are pushed apart. As a result, the left and right resilient contact portions 155 make resilient contact with the side surface portions of the column-shaped terminal 61 from the left and right due to the spring action of the arm portion 155b. Reactive force occurs at the points of resilient contact, but the reaction force is canceled out by the resilient contact with the side surface portions of the column-shaped terminal 61 from both the left and the right.

When the cable-side connecting portion 101 is inserted into the insertion slot 2a, the resilient contact portion 165 and non-resilient contact portion 166 of the second flat terminal 161 of the cable-side connecting portion 101 also make contact with side surface portions of the column-shaped terminal 61, and the resilient contact portion 165 is pushed apart. In this way, the resilient contact portion 165 makes resilient contact with a side surface portion of the column-shaped terminal 61 from one side due to the spring action of the arm portion 165b. Reactive force occurs at the point of resilient contact, but the reactive force is canceled out because each pair of left and right second flat terminals 161 are arranged in opposite directions laterally. In other words, the reactive force of a second flat terminal 161 including a resilient contact portion 165 making contact with a column-shaped terminal 61 from one side is canceled out by the reactive force of the second flat terminal 161 including a resilient contact portion 165 making contact with another column-shaped terminal 61 from the other side.

Also, because a recessed surface is formed by the small diameter portion 63 in the side surface portions of a column-shaped terminal 61 making resilient contact with the resilient contact portions 155, 165 of flat terminals 151, 161, the position of contact with the resilient contact portions 155, 165 can be defined. As a result, the resilient contact portions 155, 165 of the flat terminals 151, 161 can be prevented from coming off the column-shaped terminal 61, and good contact can be maintained between the column-shaped terminal 61 and the flat terminals 151, 161.

When the resilient contact portions 155, 165 of flat terminals 151, 161 make resilient contact with side surface portions of a column-shaped terminal 61 from the left and right, the positional tolerance of the column-shaped terminal 61 has to be kept within a narrow resilient displacement tolerance range. However, this demand can be satisfied by forming the column-shaped terminals 61 with great precision using an etching method.

The following description concerns alternate embodiments of the Present Disclosure. Elements with the same configuration as those in the first embodiment are denoted by the same reference numbers and further explanation of these elements has been omitted. Further explanation of all operations and effects similar to those of the first embodiment has also been omitted.

Figure 7:
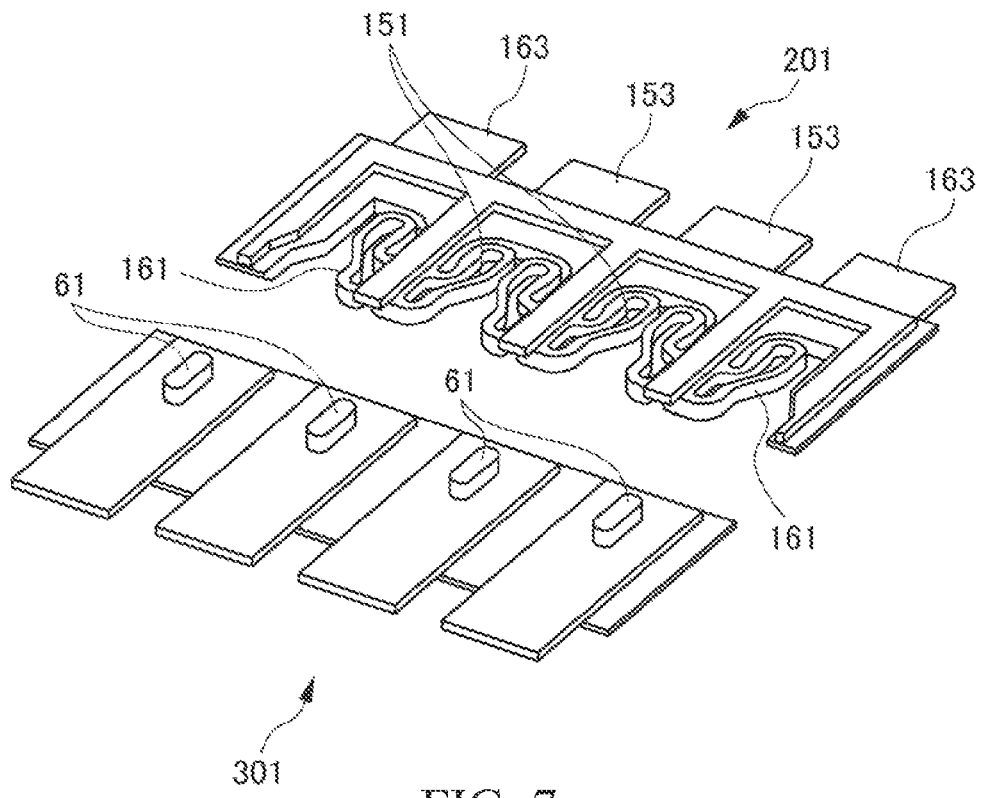
FIG. 7 is a perspective view showing the board-side connecting portion and the cable-side connecting portion in the connector for a multilayered board according to another embodiment of the Present Disclosure.

FIG. 7 is a perspective view showing the board-side connecting portion and the cable-side connecting portion in the connector for a multilayered board according to a second embodiment of the Present Disclosure. As shown, the connector for a multilayered board according to the second embodiment of the Present Disclosure differs from the first embodiment in that the board-side connecting portion 201 includes flat terminals 151, 161, and the cable-side connecting portion 301 includes a column-shaped terminal 61. In this case, the board-side connecting portion 201 is formed separately from the multilayered board 2, and mounted inside the insertion portion 2a of the multilayered board 2. When the board-side connecting portion 201 has been inserted into the insertion slot 2a of the multilayered board 2, the tail portions 153, 163 of the flat terminals 151, 161 have to be soldered to a conductive pattern inside the insertion slot 2a. This can be realized by applying granulated or powdered solder or a thermocured conductive adhesive on the tail portion 153, 163, inserting the tail portions into the insertion slot 2a, and then performing a heat treatment.

Figure 8:
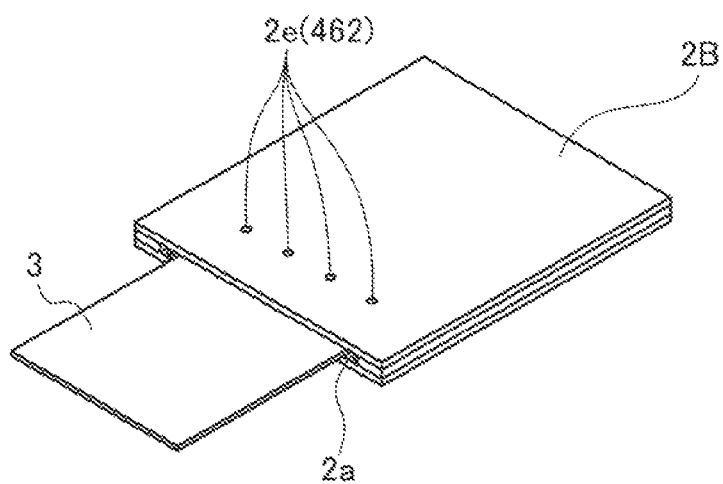
FIG. 8 is a perspective view showing the connected multilayered board and the flat cable in the connector for a multilayered board according to another embodiment of the Present Disclosure.
Figure 9:
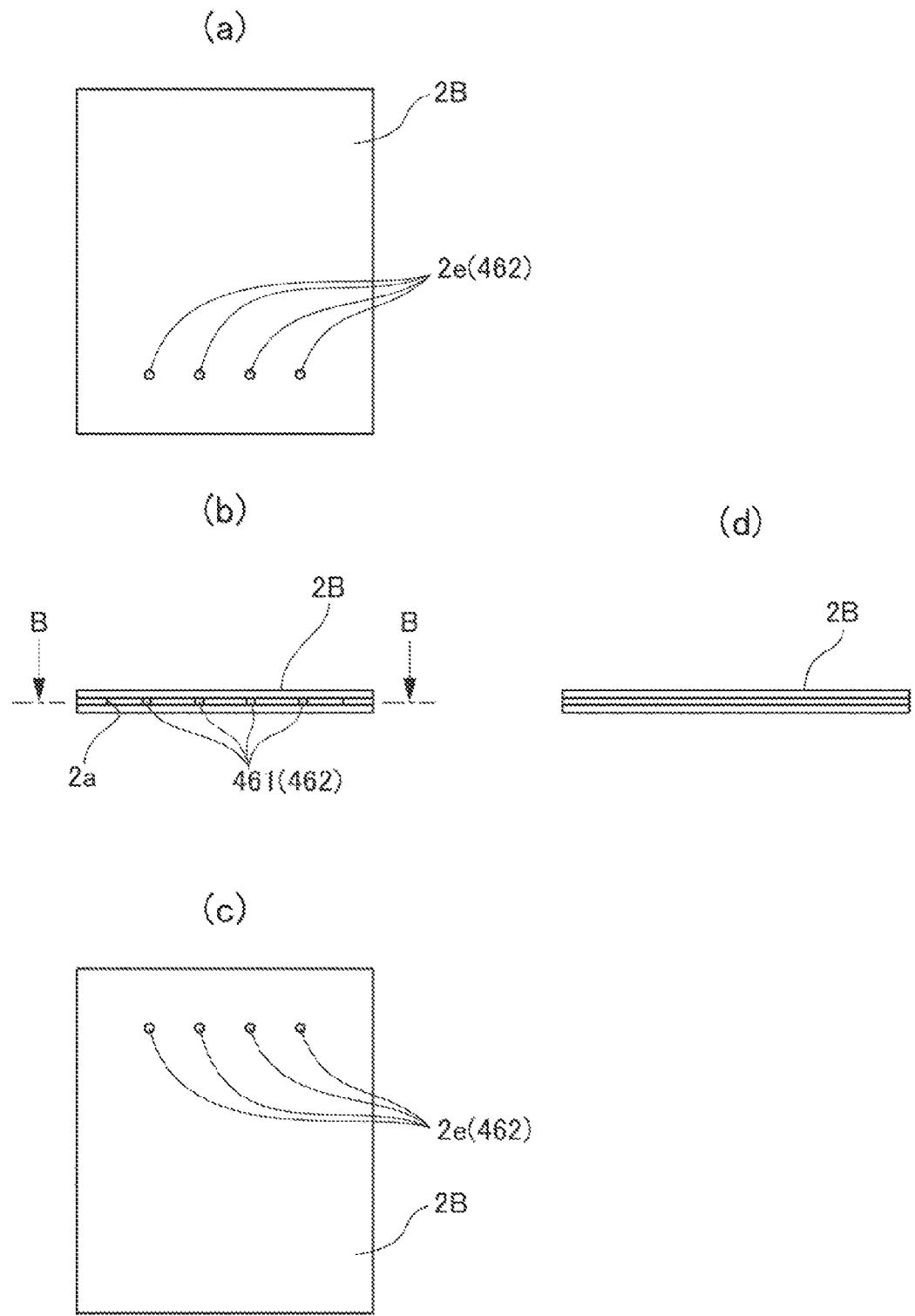
FIG. 9 shows the multilayered board in the connector for the multilayered board of FIG. 8, in which (a) is a top view of the multilayered board, (b) is a front view of the multilayered board, (c) is a bottom view of the multilayered board, and (d) is a side view of the multilayered board.
Figure 10:
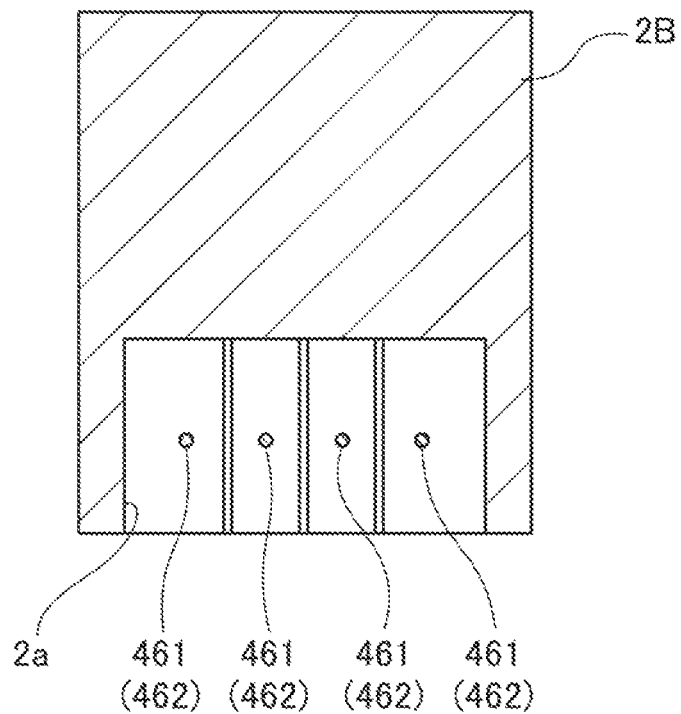
FIG. 10 shows a cross-sectional view, via Line B-B of the multilayered board in the connector for a multilayered board of FIG. 8.

FIG. 8 is a perspective view showing the connected multilayered board and the flat cable in the connector for a multilayered board according to a third embodiment of the Present Disclosure. FIG. 9 shows the multilayered board in the connector for a multilayered board according to the third embodiment of the Present Disclosure, in which (a) is a top view of the multilayered board, (b) is a front view of the multilayered board, (c) is a bottom view of the multilayered board, and (d) is a side view of the multilayered board. FIG. 10 shows a cross-sectional view, via Line B-B, of the multilayered board in the connector for a multilayered board according to the third embodiment of the Present Disclosure. As shown, the connector for a multilayered board according to the third embodiment of the Present Disclosure differs from the previous embodiments in that the column-shaped terminal 461 of the board-side connecting portion 401 is formed using a conductive pin 462. Here, the pin 462 can be arranged inside the insertion slot 2a of the multilayered board 2B by inserting the pin through an insertion hole 2e formed in the top and bottom laminated substrates 2b, 2d of the insertion slot 2a.

Figure 11:
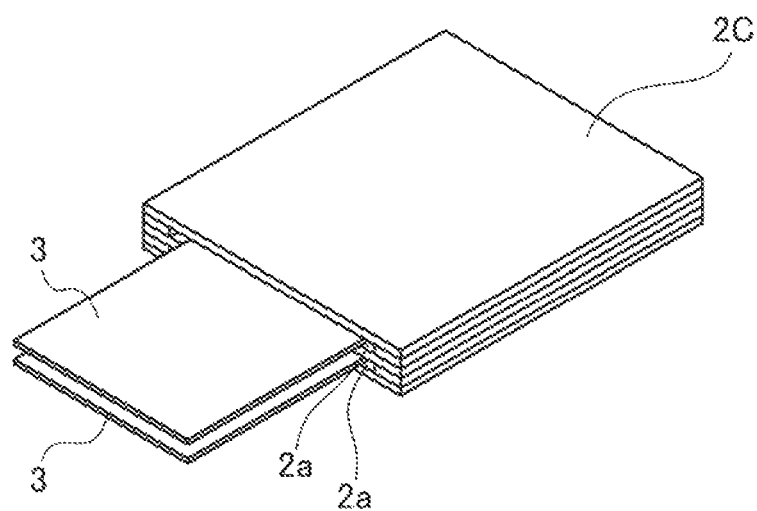
FIG. 11 is a perspective view showing the connected multilayered board and the flat cable in the connector for a multilayered board according to another embodiment of the Present Disclosure.
Figure 12:
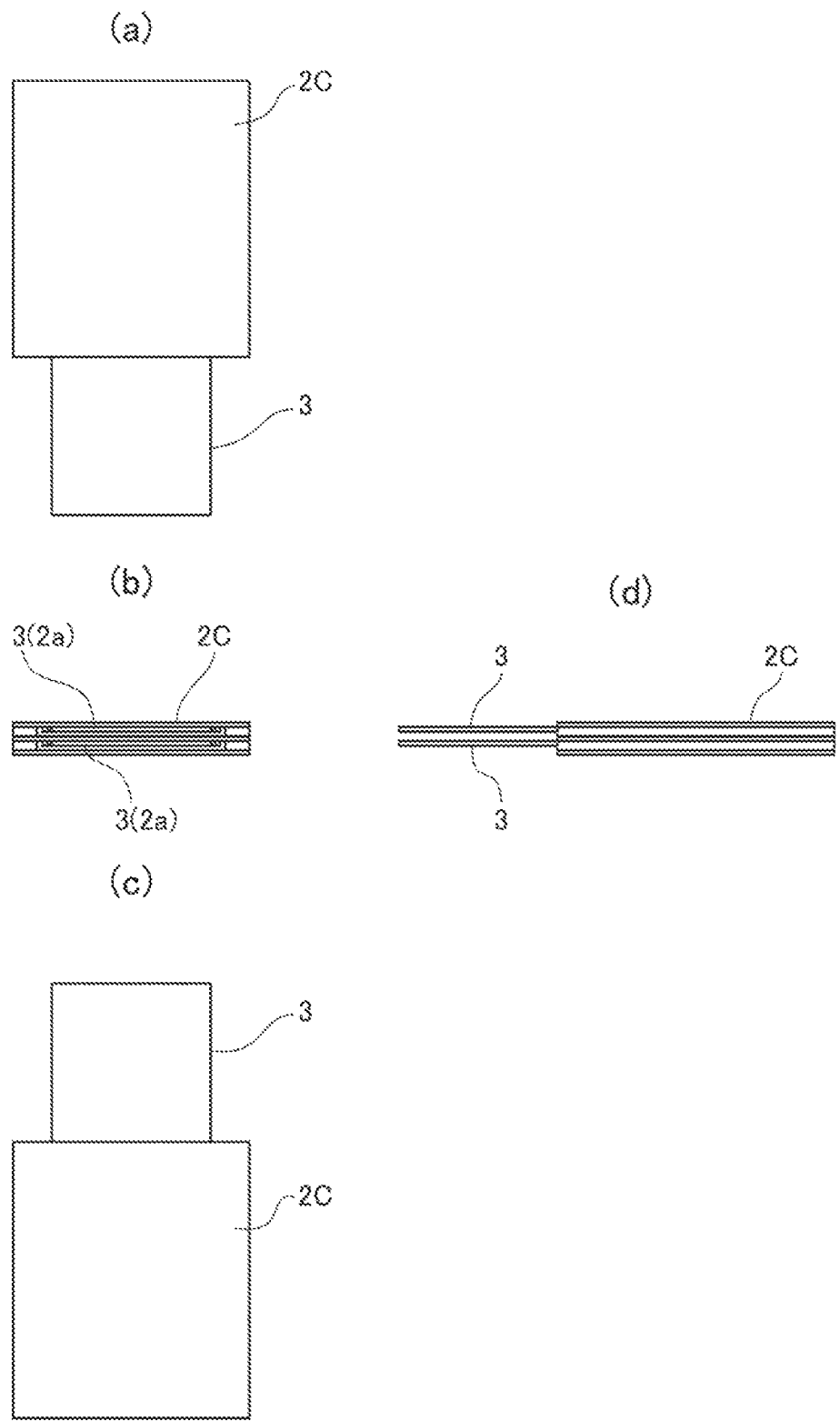
FIG. 12 shows the multilayered board and the flat cable in the connector for a multilayered board of FIG. 11, in which (a) is a top view of the multilayered board and the flat cable, (b) is a front view of the multilayered board and the flat cable, (c) is a bottom view of the multilayered board and the flat cable, and (d) is a side view of the multilayered board and the flat cable.

FIG. 11 is a perspective view showing the connected multilayered board and the flat cable in the connector for a multilayered board according to a fourth embodiment of the Present Disclosure. FIG. 12 shows the multilayered board and the flat cable in the connector for a multilayered board according to the fourth embodiment of the Present Disclosure, in which (a) is a top view of the multilayered board and the flat cable, (b) is a front view of the multilayered board and the flat cable, (c) is a bottom view of the multilayered board and the flat cable, and (d) is a side view of the multilayered board and the flat cable. As shown, the connector for a multilayered board according to the fourth embodiment of the Present Disclosure differs from the previous embodiments in that a multilayered board 2 with a plurality of middle layers is provided. For example, in the example shown, the multilayered board 2C has five layers, an insertion slot 2a is provided in the second and fourth layers on the same board-thickness surface, and a board-side connecting portion is configured inside each insertion slot 2a. In this case, a flat cable 3 can be connected to both of the middle layers of the multilayered board 2C.

Figure 13:
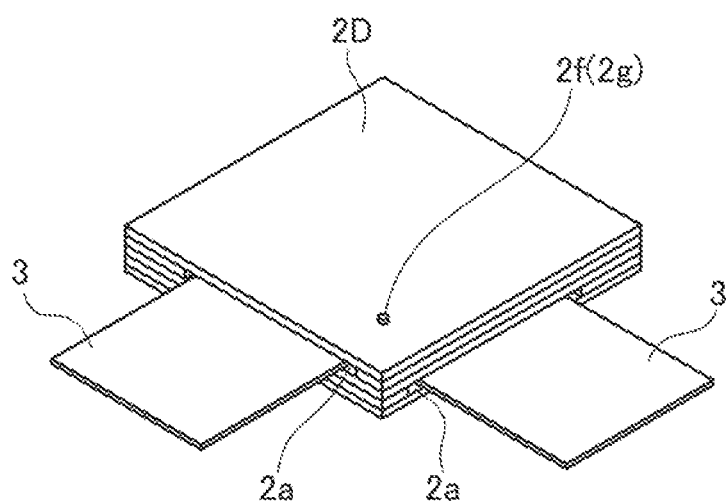
FIG. 13 is a perspective view showing the connected multilayered board and the flat cable in the connector for a multilayered board according to another embodiment of the Present Disclosure.
Figure 14:
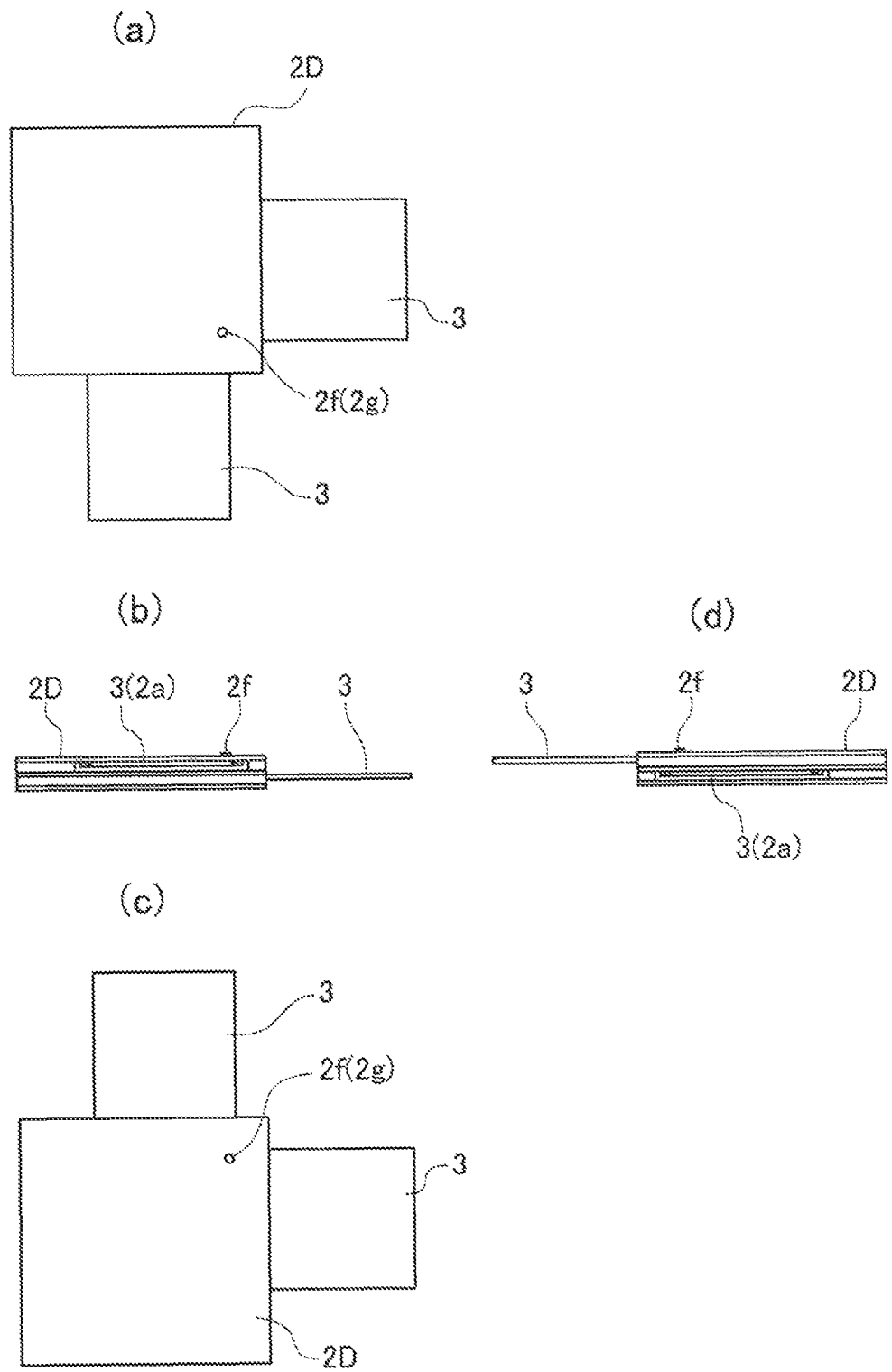
FIG. 14 shows the multilayered board and the flat cable in the connector for a multilayered board of FIG. 13, in which (a) is a top view of the multilayered board and the flat cable, (b) is a front view of the multilayered board and the flat cable, (c) is a bottom view of the multilayered board and the flat cable, and (d) is a side view of the multilayered board and the flat cable.
Figure 15:
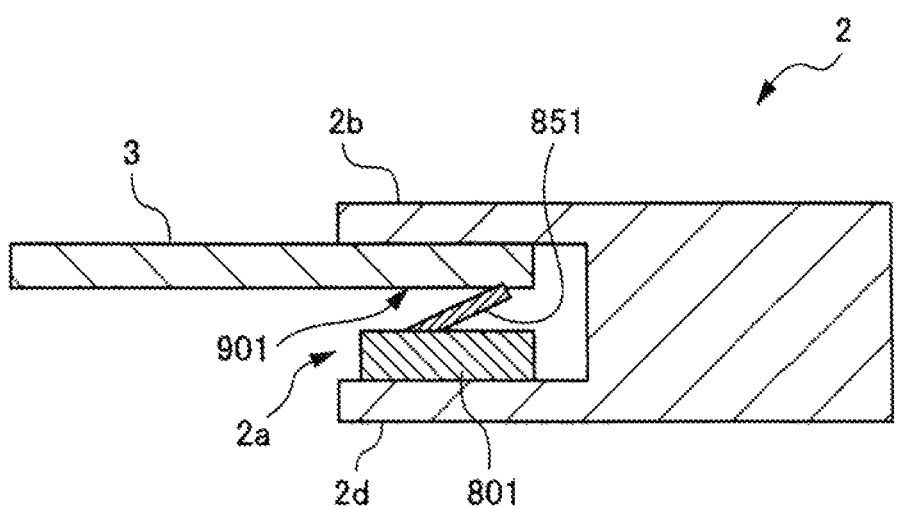
FIG. 15 is a simplified cross-sectional view showing a conventional connector for a multilayered board.

FIG. 13 is a perspective view showing the connected multilayered board and the flat cable in the connector for a multilayered board according to a fifth embodiment of the Present Disclosure. FIG. 14 shows the multilayered board and the flat cable in the connector for a multilayered board according to the fifth embodiment, in which (a) is a top view of the multilayered board and the flat cable, (b) is a front view of the multilayered board and the flat cable, (c) is a bottom view of the multilayered board and the flat cable, and (d) is a side view of the multilayered board and the flat cable. As shown, the connector for a multilayered board according to the fifth embodiment of the Present Disclosure is similar to the fourth embodiment in that the multilayered board 2D is provided with a plurality of middle layers. However, it differs from the fourth embodiment in that flat cables 3 can be connected to the multilayered board 2D from different directions. For example, the multilayered board 2D has five layers, an insertion slot 2a is provided in the second and fourth layers on adjacent board-thickness surfaces, and a board-side connecting portion is configured inside each insertion slot 2a. In this case, a flat cable 3 can be connected to either of the middle layers of the multilayered board 2C from different directions.

The connector for a multilayered board according to the fifth embodiment includes a retaining structure for retaining two connected flat cables 3 connected to the multilayered board 2 using a single pin 2f. The retaining structure includes an insertion hole 2g formed in the multilayered board 2 so as to vertically pass through the flat cables 3 (cable-side connecting portions 101) inserted from different directions at an overlapping location in plan view, and an engagement hole (not shown) formed in the flat cable 3 (cable-side connecting portion 101) so as to align with the insertion hole 2g when inserted. The pin 2f is inserted into the insertion hole 2g after the cables have been inserted to engage the pin 2f with the engagement holes in the two flat cables 3 and retain both flat cables 3.

While a preferred embodiment of the Present Disclosure is shown and described, it is envisioned that those skilled in the art may devise various modifications without departing from the spirit and scope of the foregoing Description and the appended Claims.

What is claimed is:

1. A connector for a multilayered board, the connector comprising:
   a board-side connecting portion, the board-side connecting portion being arranged inside an insertion slot, the insertion slot being formed on a board-thickness surface of the multilayered board; and
   a cable-side connecting portion, the cable-side connecting portion being provided on the tip of a flat cable and inserted into the insertion slot to be connected electrically to the board-side connecting portion in a middle layer of the multilayered board;
   wherein one of the board-side connecting portion or the cable-side connecting portion includes a column-shaped terminal, and the other including a flat terminal, the column-shaped terminal protruding from the middle layer of the multilayered board or from the tip of the flat cable in the thickness direction of the multilayered board or the flat cable;
   the flat terminal including a resilient contact portion, the contact portion contacting a side surface portion of the column-shaped terminal from the width direction of the insertion slot in response to insertion of the cable-side connecting portion into the insertion slot.

2. The connector of claim 1, wherein the flat terminal and the column-shaped terminal each include a plurality of contact spots, and reaction forces of the flat terminal generated at each contact spot cancel each other out, when the board-side and cable-side connecting portions are mated together.

3. The connector of claim 2, wherein the reaction force of the flat terminal, making contact with the column-shaped terminal from one side, cancels out the reaction force of the flat terminal, making contact with the column-shaped terminal from the other side.

4. The connector of claim 3, wherein the reaction force of the flat terminal, making contact with the column-shaped terminal from one side, cancels out the reaction force of the flat terminal, making contact with another column-shaped terminal from the other side.

5. The connector of claim 4, wherein the column-shaped terminal includes a small-diameter portion, the small-diameter portion defining the contact position of the flat terminal.

6. The connector of claim 5, wherein the column-shaped terminal is a protrusion formed using an etching method.

7. The connector of claim 6, wherein the board-side connecting portion includes an insertion guide, the insertion guide being formed using an etching method, and insertion of the cable-side connecting portion into the insertion slot is guided by the insertion guide.

8. The connector of claim 1, further including a plurality of column-shaped terminals and a plurality of flat terminals, equal in number to the column-shaped terminals.

9. The connector of claim 8, wherein each of the column-shaped terminals includes a small-diameter portion, the small-diameter portions defining the contact portions for the flat terminals to engage when the board-side and cable-side connecting portions are mated together.

10. A connection assembly, the connection assembly comprising:
    a circuit board including a plurality of layers arranged upon each other in a vertical direction, at least one of the layers including an insertion slot disposed along a mating edge of the circuit board, the insertion slot defining an interior receptacle for receiving a mating end of a cable, the interior receptacle having a bottom surface, the circuit board further including at least one conductive pattern provided on the bottom surface, the circuit board further including at least one first terminal disposed and extending vertically upwardly within the insertion slot from the at least one conductive pattern, the first terminal having a first contact portion disposed on a first vertically extending side of the first terminal; and,
    a cable, the cable having a flat mating end, the cable mating end being insertable into and removeable from the insertion slot of the circuit board, the cable mating end further including at least one second terminal, the second terminal having a first contact portion disposed on a first side of the second terminal, in opposition to the first contact portion of the first terminal.

11. The connection assembly of claim 10, wherein the circuit board includes a plurality of first terminals disposed with the insertion slot in a first pattern, and the cable mating end includes a plurality of second terminals supported thereon in a second pattern such that the first contact portions of the first and second terminal are arranged in opposition to each other.

12. The connection assembly of claim 11, wherein the second terminals include second contact portions disposed on second sides of the second terminals, the first and second contact portions of the second terminal facing each other.

13. The connection assembly of claim 12, wherein all of the first contact portions of the second terminals are resilient and some of the second portions of the second terminals are resilient.

14. The connection assembly of claim 11, wherein the cable mating end includes an insulative support that supports the second terminals of the cable mating end.

15. The connection assembly of claim 10, wherein the first terminal of the circuit board has a height less than a corresponding height of the insertion slot of the circuit board.

16. The connection assembly of claim 10, wherein the terminal first contact portion of the first terminal of the circuit board is recessed.

* * * * *